United States Patent
Kume et al.

(10) Patent No.: US 10,269,748 B2
(45) Date of Patent: Apr. 23, 2019

(54) SEMICONDUCTOR DEVICE AND MANUFACTURING METHOD OF SEMICONDUCTOR DEVICE

(71) Applicant: TOSHIBA MEMORY CORPORATION, Tokyo (JP)

(72) Inventors: Ippei Kume, Oita Oita (JP); Kengo Uchida, Oita Oita (JP)

(73) Assignee: Toshiba Memory Corporation, Tokyo (JP)

( * ) Notice: Subject to any disclaimer, the term of this patent is extended or adjusted under 35 U.S.C. 154(b) by 259 days.

(21) Appl. No.: 15/061,992

(22) Filed: Mar. 4, 2016

(65) Prior Publication Data

US 2016/0351521 A1    Dec. 1, 2016

(30) Foreign Application Priority Data

May 29, 2015    (JP) .................................. 2015-110744

(51) Int. Cl.
| | |
|---|---|
| *H01L 23/00* | (2006.01) |
| *H01L 23/48* | (2006.01) |
| *H01L 21/768* | (2006.01) |

(52) U.S. Cl.
CPC ........ *H01L 24/13* (2013.01); *H01L 21/76898* (2013.01); *H01L 23/481* (2013.01);
(Continued)

(58) Field of Classification Search
CPC ... H01L 24/13; H01L 24/11; H01L 21/76898; H01L 21/76831
(Continued)

(56) References Cited

U.S. PATENT DOCUMENTS

| | | | |
|---|---|---|---|
| 5,679,981 A | 10/1997 | Kuwajima | |
| 6,569,604 B1 * | 5/2003 | Bhatt | ................ H01L 23/49816 |
| | | | 257/E23.067 |

(Continued)

FOREIGN PATENT DOCUMENTS

| | | |
|---|---|---|
| CN | 1622321 A | 6/2005 |
| CN | 1722370 A | 1/2006 |

(Continued)

OTHER PUBLICATIONS

Taiwan Office Action dated Dec. 19, 2016, filed in Taiwan counterpart Application No. 104137747, 8 pages (with translation).

(Continued)

*Primary Examiner* — Bo Fan
(74) *Attorney, Agent, or Firm* — Kim & Stewart LLP

(57) ABSTRACT

A semiconductor device includes a semiconductor substrate provided with a through hole that extends therethrough from a first surface to a second surface on a side opposite to the first surface, a device layer provided at the first surface of the semiconductor substrate which includes an electrode, an insulating layer that covers the device layer, a first through electrode that extends through the insulating layer, an insulating layer that extends from the second surface of the semiconductor substrate to a bottom surface of the through hole through an inner surface of the through hole of the semiconductor substrate, and in which the portion thereof in contact with the bottom surface has a tapered shape, and a second through electrode electrically connected to the electrode in the device layer that is exposed to the bottom surface of the through hole.

7 Claims, 9 Drawing Sheets

(52) U.S. Cl.
CPC ........ *H01L 24/11* (2013.01); *H01L 21/76831* (2013.01); *H01L 2224/10126* (2013.01); *H01L 2224/13017* (2013.01); *H01L 2224/13025* (2013.01); *H01L 2224/13083* (2013.01)

(58) Field of Classification Search
USPC ..................... 438/455; 257/737, 774; 439/70
See application file for complete search history.

(56) References Cited

U.S. PATENT DOCUMENTS

| | | | |
|---|---|---|---|
| 7,094,701 | B2 | 8/2006 | Umemoto et al. |
| 7,416,963 | B2 | 8/2008 | Umemoto et al. |
| 7,419,382 | B2* | 9/2008 | Suzuki ................... H01L 24/11 257/E21.508 |
| 8,169,054 | B2 | 5/2012 | Oikawa |
| 9,349,673 | B2 | 5/2016 | Yoda |
| 9,659,841 | B2 | 5/2017 | Nomura |
| 2003/0056981 | A1* | 3/2003 | Furukuwa ........... H01L 23/3735 174/258 |
| 2004/0033673 | A1* | 2/2004 | Cobbley ................ H01L 21/56 438/455 |
| 2004/0251552 | A1 | 12/2004 | Takewaki et al. |
| 2009/0283847 | A1 | 11/2009 | Kawasaki et al. |
| 2010/0144094 | A1* | 6/2010 | Chen ................ H01L 21/76898 438/109 |
| 2012/0068334 | A1* | 3/2012 | Migita ................... H01L 24/11 257/737 |
| 2012/0276733 | A1 | 11/2012 | Saeki et al. |
| 2012/0315758 | A1 | 12/2012 | Sakurai et al. |
| 2013/0234341 | A1 | 9/2013 | Onai |

FOREIGN PATENT DOCUMENTS

| | | |
|---|---|---|
| CN | 1738002 A | 2/2006 |
| CN | 101154577 A | 4/2008 |
| CN | 104600024 A | 5/2015 |
| JP | 2947054 B2 | 9/1999 |
| JP | 2006032695 A | 2/2006 |
| JP | 2008091628 A | 4/2008 |
| JP | 2009158862 A | 7/2009 |
| JP | 2012099548 A | 5/2012 |
| JP | 2012-142414 A | 7/2012 |
| JP | 2012256639 A | 12/2012 |
| JP | 2014011309 A | 1/2014 |
| TW | 201403780 A | 1/2014 |

OTHER PUBLICATIONS

Japanese Office Action dated Apr. 24, 2018, filed in Japanese counterpart Application No. 2015-110744, 9 pages (with translation).

Chinese Office Action dated Apr. 4, 2018, filed in Chinese counterpart Application No. 2015108480783, 13 pages (with translation).

Japanese Office Action dated Dec. 4, 2018, mailed in counterpart Japanese Application No. 2015-110744, 8 pages (with translation).

* cited by examiner

SEMICONDUCTOR DEVICE AND MANUFACTURING METHOD OF SEMICONDUCTOR DEVICE

CROSS-REFERENCE TO RELATED APPLICATION

This application is based upon and claims the benefit of priority from Japanese Patent Application No. 2015-110744, filed May 29, 2015, the entire contents of which are incorporated herein by reference.

FIELD

Embodiments described herein relate generally to a semiconductor device and a method for manufacturing a semiconductor device.

BACKGROUND

In recent years, integration of semiconductor substrates to form a semiconductor device using a through-silicon (or through-substrate) via (TSV) has attracted attention from the viewpoint of higher performance of the resulting semiconductor device.

In the integration technology using a TSV, stability of a through electrode formed in the TSV (also referred to as a TSV electrode) is very important. However, since a TSV has a high aspect ratio, it is difficult to embed a metal or the like into the hole in the substrate in which the TSV is to be formed.

DETAILED DESCRIPTION

In general, according to one embodiment, a semiconductor device includes a semiconductor substrate provided with a through hole penetrating therethrough from a first surface to a second surface thereof opposite to the first surface, a device layer provided at the first surface of the semiconductor substrate which includes an electrode, an insulating layer that covers the device layer, a first through electrode penetrating the insulating layer, an insulating layer extending from the second surface of the semiconductor substrate to a bottom surface of the through hole through an inner surface of the through hole of the semiconductor substrate, and in which a shape of a portion in contact with the bottom surface is a tapered shape, and a second through electrode electrically connected to the wiring in the device layer that is exposed to the through hole.

Hereinafter, a semiconductor device and a method for manufacturing a semiconductor device according to embodiments will be described in detail with reference to the drawings. In addition, the embodiments do not limit the present disclosure. Further, in the following description, an element formation surface of a semiconductor substrate in which elements are to be formed is defined as a first surface, and a surface opposite to the first surface is defined as a second surface.

Figure 1:
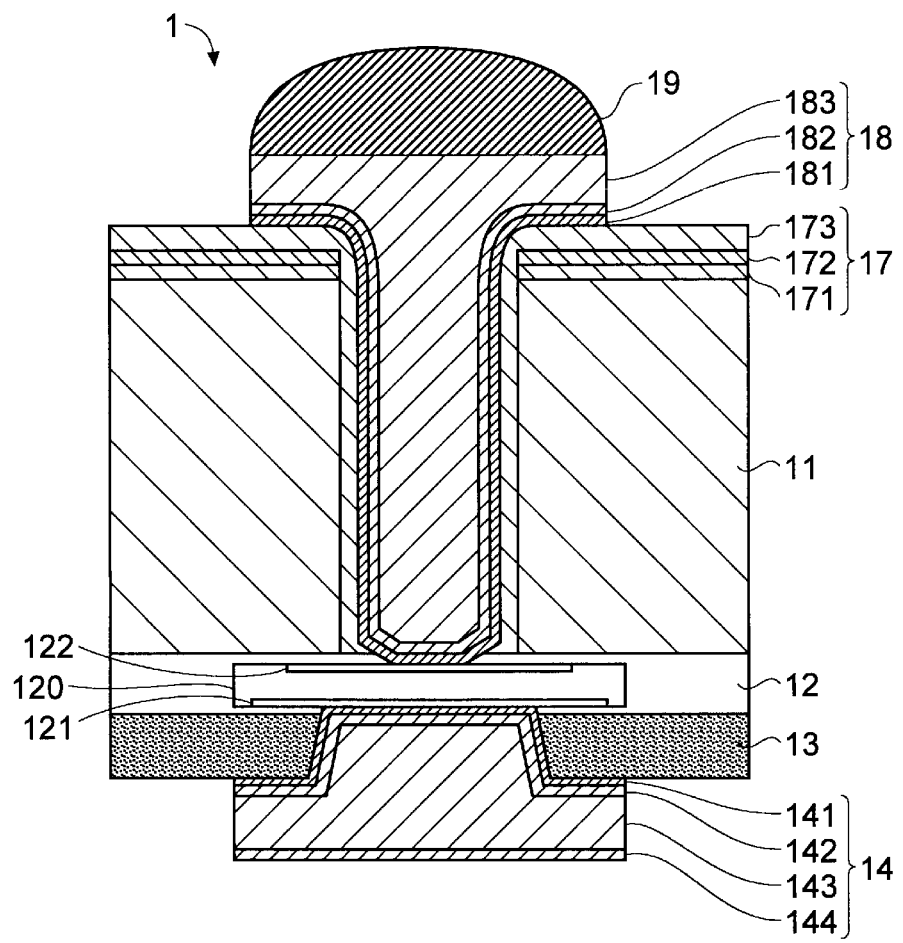
FIG. 1 is a cross-sectional view illustrating a schematic configuration example of a semiconductor device according to an embodiment.

FIG. 1 is a sectional view illustrating a schematic configuration example of a semiconductor device according to an embodiment. As illustrated in FIG. 1, the semiconductor device 1 includes a semiconductor substrate 11, a device layer 12, an insulating layer 13, a first through electrode 14, an insulating layer 17, a second through electrode 18, and a bonding material 19.

The semiconductor substrate 11 is, for example, a silicon substrate. The semiconductor substrate 11 may be thinned to 50 μm (micrometer) or less, for example, about 30 μm (±5 μm).

The device layer 12 includes a device structure formed on the first surface side which is an element formation surface of the semiconductor substrate 11, and an inter-layer insulating film for filling the device structure. The inter-layer insulating film may be a silicon oxide film ($SiO_2$). The device structure includes a wiring layer 120. The wiring layer 120 includes an upper layer wiring 121 formed on the upper layer, and a lower layer wiring 122 formed on the lower layer. In addition, the upper layer and lower layer of the device layer 12 may be the upper layer and the lower layer with the element formation surface of the semiconductor substrate 11 as a reference upper side of the substrate 11.

The insulating layer 13 covers the device layer 12 for the purpose of protecting the device layer 12. The insulating layer 13 may include a passivation layer covering the device layer 12, and an organic layer covering the passivation layer. The passivation layer is a single layer film of a silicon nitride film (SiN), a silicon oxide film ($SiO_2$), or a silicon oxynitride film (SiON) or may be two or more stacked film layers thereof. Resin material such as photosensitive polyimide may be used for the organic layer.

The first through electrode 14 is formed in a through hole penetrating through the insulating layer 13 to the upper layer wiring 121 in the device layer 12, where it comes into contact with the upper layer wiring 121. The first through electrode 14 may include at least a barrier metal layer 141 that covers the surface in the through hole, a seed metal layer 142 on the barrier metal layer 141, and a through electrode 143 on the seed metal layer 142. The barrier metal layer 141 may be omitted. A material film 144 which functions during the integration of the semiconductor device 1 in a vertical direction may be provided on the through electrode 143.

Titanium (Ti), tantalum (Ta), ruthenium (Ru), and the like may be used for the barrier metal layer 141. Copper (Cu) or a stacked film (Ni/Cu) of nickel and copper may be used for the seed metal layer 142. Nickel (Ni), and the like may be used for the through electrode 143. Gold (Au), tin (Sn), copper (Cu), tin-copper (SnCu), tin-gold (SnAu), tin-silver (SnAg), or the like may be used for the material film 144. However, the layer structure and material of the first through electrode 14 may be appropriately changed depending on the purpose. For example, the layer structure and material of the barrier metal layer 141/the seed metal layer 142 or the material film 144 may be appropriately changed depending on a conductive material and a forming method used for the through electrode 143.

The second through electrode 18 is formed in a through hole (TSV) and extends from the second surface of the semiconductor substrate 11, through the semiconductor substrate 11 to the lower layer wiring 122 in the device layer 12, and comes into contact with the lower layer wiring 122 to electrically connects the lower layer wiring 122 to the second surface of the semiconductor substrate 11.

The second through electrode 18, similarly to the first through electrode 14, may include at least a barrier metal layer (first metal layer) 181 which covers a surface in a through hole, a seed metal layer (second metal layer) 182 on the barrier metal layer 181, and a through electrode (third metal layer) 183 on the seed metal layer 182. The metal materials used in the respective layers may be the same as those of the barrier metal layer 141, the seed metal layer 142 and the through electrode 143 of the first through electrode 14. Voids may be formed inside the through electrode 183. Further, a bonding material 19 for bonding together semiconductor devices 1 formed of the semiconductor substrate 11 during the integration of a plurality of semiconductor devices 1 in the vertical direction (thickness direction of the semiconductor substrate 11) may be provided on the through electrode 183. A solder such as Tin (Sn), copper (Cu), tin-copper (SnCu), tin-gold (SnAu), tin-silver (SnAg) and the like may be used for the bonding material 19.

An insulating layer 17 for preventing a short circuit between the second through electrode 18 and the semiconductor substrate 11 is provided on the second surface of the semiconductor substrate 11 and on the inner wall surface of the through hole. The insulating layer 17 may include a silicon oxide film ($SiO_2$) 171 arranged on the second surface of the semiconductor substrate 11, a silicon nitride film (SiN) 172 arranged on the silicon oxide film. 171, and a silicon oxide film 173 located over the silicon nitride film (SiN) 172 and extending therefrom on the inner wall surface of the through hole (TSV). The silicon oxide film 171 and/or the silicon nitride film 172 may be referred to as a first insulating film in some cases. Further, the silicon oxide film 173 may be referred to as a second insulating film in some cases.

Figure 2:
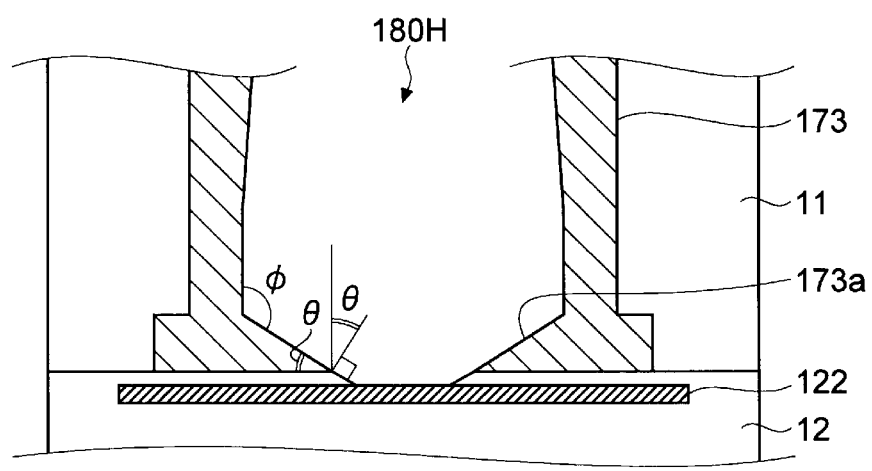
FIG. 2 depicts an example of a shape of a silicon oxide film in the vicinity of a bottom of a through hole according to the embodiment.

The shape of the silicon oxide film 173 lining the inside of the through hole (TSV) will be described with reference to FIG. 2. FIG. 2 is a partial sectional view illustrating an example of a shape of a silicon oxide film in the vicinity of a bottom of the through hole (TSV). As illustrated in FIG. 2, the silicon oxide film 173 has, in section, a tapered shape 173a in the bottom of the through hole (TSV) 180H. Thus, since the bottom of the silicon oxide film 173 has the tapered shape 173a, the angle φ between the silicon oxide film 173 formed on the side surface of the through hole (TSV) 180H and the surface of the tapered shape 173a is obtuse. Accordingly, it is possible to form the barrier metal layer 181 and the seed metal layer 182 more stably in this portion, that is, the corner portion of the bottom of the silicon oxide film 173.

Figure 3:
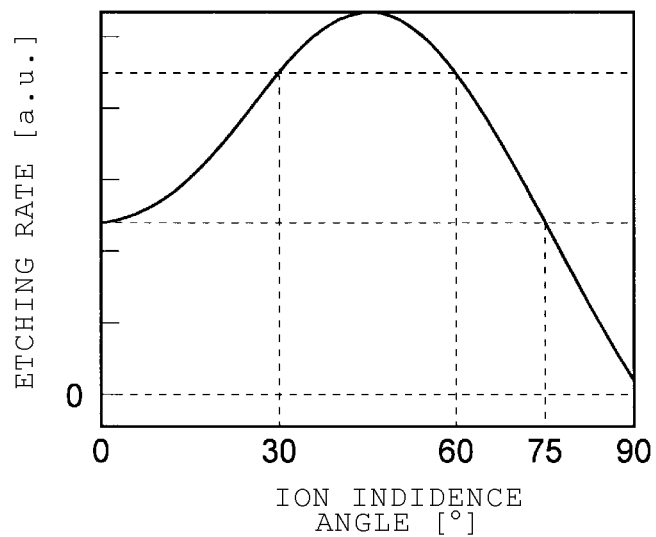
FIG. 3 is a graph representing a relationship between an ion incidence angle and an etching rate.

Further, since the bottom of the silicon oxide film 173 has the tapered shape 173a, the incident angle θ ions reaching the tapered surface of the silicon oxide film 173 at the bottom of the through via 180H during the formation of the barrier metal layer 181 and the seed metal layer 182 is offset from perpendicular to the tapered surface. Here, FIG. 3 represents a relationship between an ion incidence angle and an etching rate. As illustrated in FIG. 3, when the incident angle θ of ions is in a range of from 0° to 75° ($0°<θ≤75°$), the etching rate is increased, as compared with the case where the incident angle θ of ion is 0°. In particular, when the incident angle θ of ions is in a range of from 30° to 60° ($30°≤θ≤60°$), more than twice etching rate of the etching rate in the case where the incident angle θ of ion is 0° is achieved.

Therefore, in the embodiment, the elevation angle θ of the slope of the tapered shape 173a of the bottom of the silicon oxide film 173 is between 0° and 75°, preferably between 30° and 60°. Thus, the efficiency of the reverse sputtering (sputter etching) of the metal layer that is generated during the formation of the barrier metal layer 181 and the seed metal layer 182 is enhanced. As a result, since the amount of metal atoms scattered to the corners of the bottom of the silicon oxide film 173 by reverse sputtering is increased, it is possible to form the barrier metal layer 181 and the seed metal layer 182 more stably.

Subsequently, the manufacturing method of the semiconductor device 1 according to the embodiment will be described in detail with reference to the drawings. FIG. 4 to FIG. 11 are cross-sectional views illustrating a manufacturing method of a semiconductor device according to the embodiment. In addition, in FIG. 4 to FIG. 11, a description will be made using the same cross section view as in FIG. 1. However, in FIG. 4, for convenience of explanation, the upper and lower relationship of the section is reversed to the upper and lower relationship of FIG. 1 and FIG. 5 to FIG. 11.

First, in the embodiment, a device structure is formed on the element formation surface (first surface) of the semiconductor substrate 11, and the formed device structure is covered with an interlayer insulating film. Thus, the device layer 12 is formed. In addition, various insulating films such as a so-called device isolation insulating film and various layers such as a wiring layer may be included in the interlayer insulating film. Then, the insulating layer 13 is formed on the device layer 12. As described later, a passivation layer that covers the device layer 12, and an organic layer that covers the passivation layer may also be included in the insulating layer 13. In the organic layer, a photosensitive polyimide and the like are used, and a pattern opening for forming the opening for the first through electrode 14 in the organic layer in the insulating layer 13 is formed therein. The opening diameter of the opening pattern may be, for example, about 10 μm.

Then, the upper layer wiring 121 of the device layer 12 is exposed by etching the passivation layer and the insulating layer 13 and the interlayer insulating film upper layer portion of the device layer 12 using the organic layer as a mask. Reactive ion etching (RIE) may be used for the etching of the passivation layer and the interlayer insulating film. Subsequently, a barrier metal layer using titanium (Ti) and a seed metal layer using copper (Cu) are sequentially formed on the entire of the insulating layer 13 including the inside of the through hole. A sputtering method and a chemical vapor deposition (CVD) method may be respectively used for forming films on the barrier metal layer and the seed metal layer. The film thickness of the seed metal layer may be, for example, about 500 nm.

Then, a mask for forming a through electrode 143 on the seed metal layer is formed, for example, using photolithography to pattern a mask with openings corresponding to the locations where the through electrode(s) 143 are to be formed. Thus, a mask opening is formed on the position corresponding to the through hole formed in the insulating layer 13. Subsequently, the through electrode 143 using the nickel (Ni) is formed on the seed metal layer exposed within the opening of the mask. Conformal plating and the like may be used for the through electrode 143.

Then, after removing the mask, the exposed seed metal layer and barrier metal layer extending outward on the surface of the insulating film 13 beyond the boundaries of the through electrode 143 are removed. As a result, the seed metal layer 142 and the barrier metal layer 141 under the through electrode 143 remain in place. Wet etching may be used for the removal of the portions of the seed metal layer 142 and the barrier metal layer 141 not covered by the through electrode.

Figure 4:
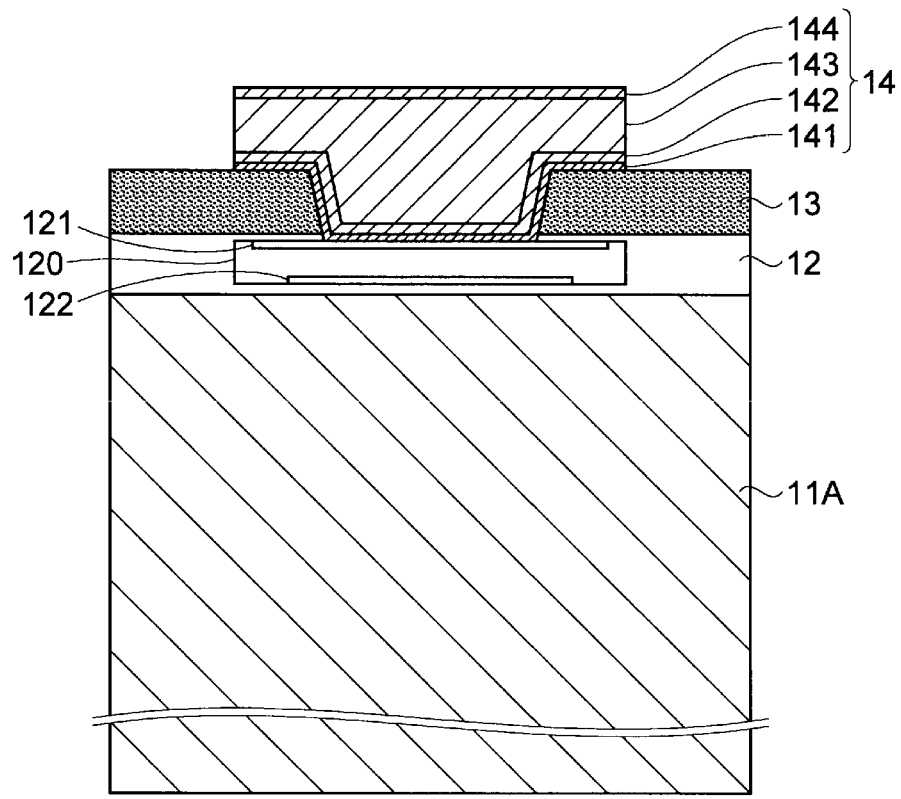
FIG. 4 to FIG. 11 illustrate processes in a manufacturing method of a semiconductor device according to the embodiment.

Then, a material film 144 such as gold (Au) is formed on the upper surface of the through electrode 143. A forming method such as lift-off may be used for forming the material film 144. As a result, as illustrated in FIG. 4, a first through electrode 14 which extends the upper layer wiring 121 of the device layer 12 through the insulating layer 13 is formed on the element formation surface (first surface) side of the semiconductor substrate 11.

Figure 5:
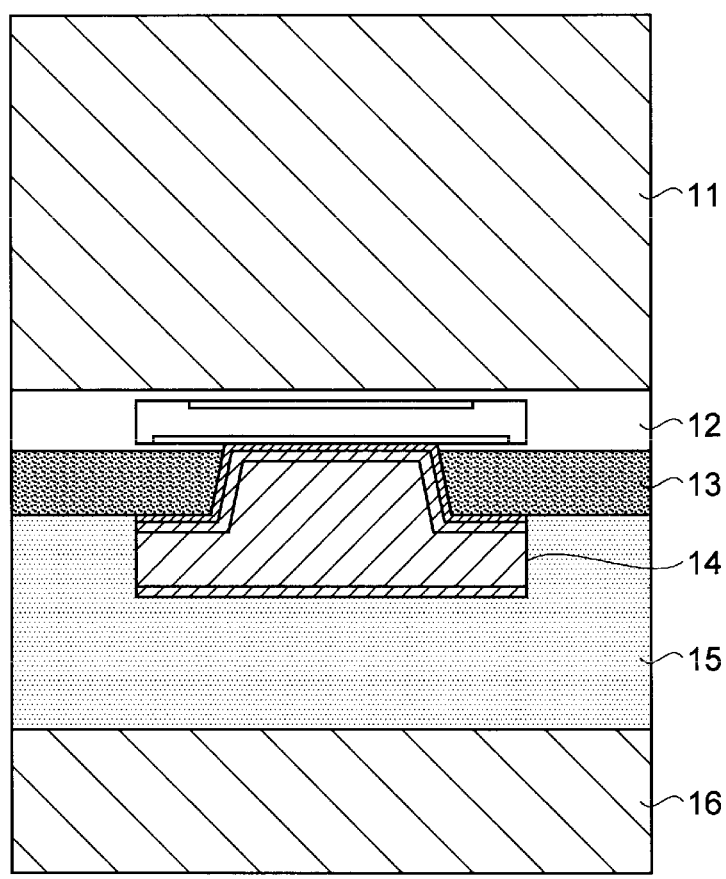

Then, an adhesive agent is coated on the insulating layer 13 in which the first through electrode 14 is formed, and a supporting substrate 16 is bonded to the adhesive agent, as illustrated in FIG. 5, the supporting substrate 16 is adhered to the element formation surface side of the semiconductor device 1. Subsequently, the semiconductor substrate 11 is thinned to, for example, about 30±5 μm, by grinding away a portion of the second surface side of the semiconductor substrate 11 on the opposite side to the element formation surface (first surface), in a state in which the supporting substrate 16 is secured to a stage.

Figure 6:
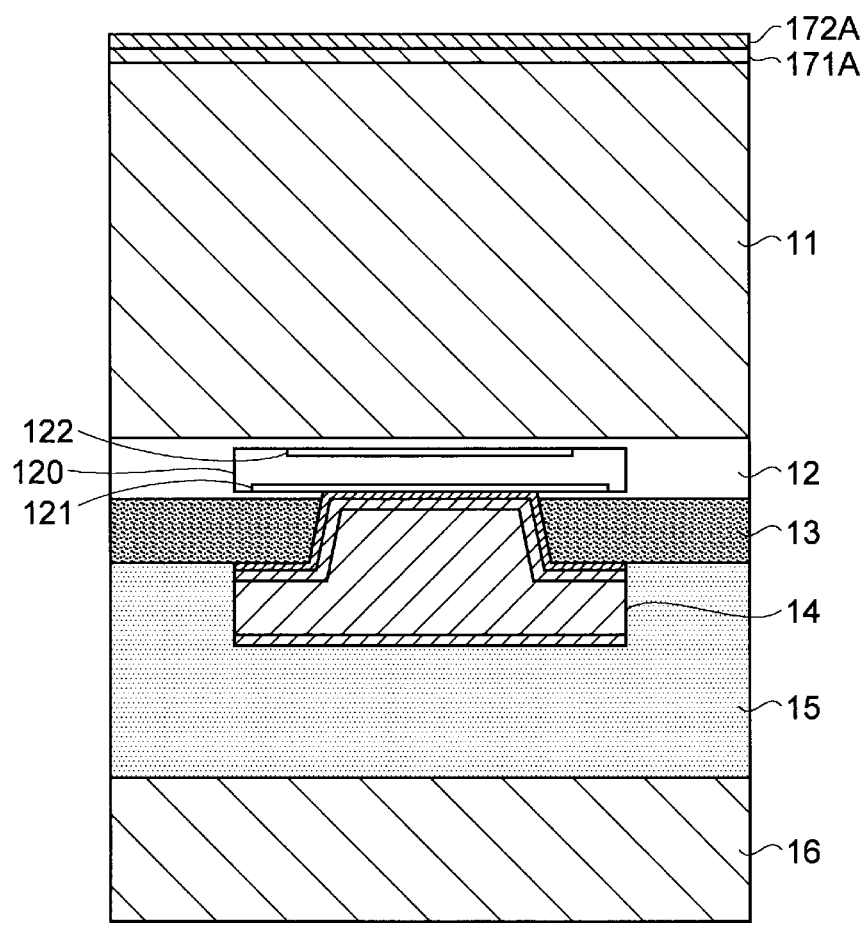

Then, as illustrated in FIG. 6, the silicon oxide film 171A and the silicon nitride film 172A are sequentially formed on the second surface of the semiconductor substrate 11. The silicon oxide film 171A may be a thermal oxidation film formed by heat treatment of the substrate in an oxygen atmosphere, or a film formed by a CVD method. Further, the silicon nitride film 172A may be various nitride films such as a film formed by a CVD method.

Figure 7:
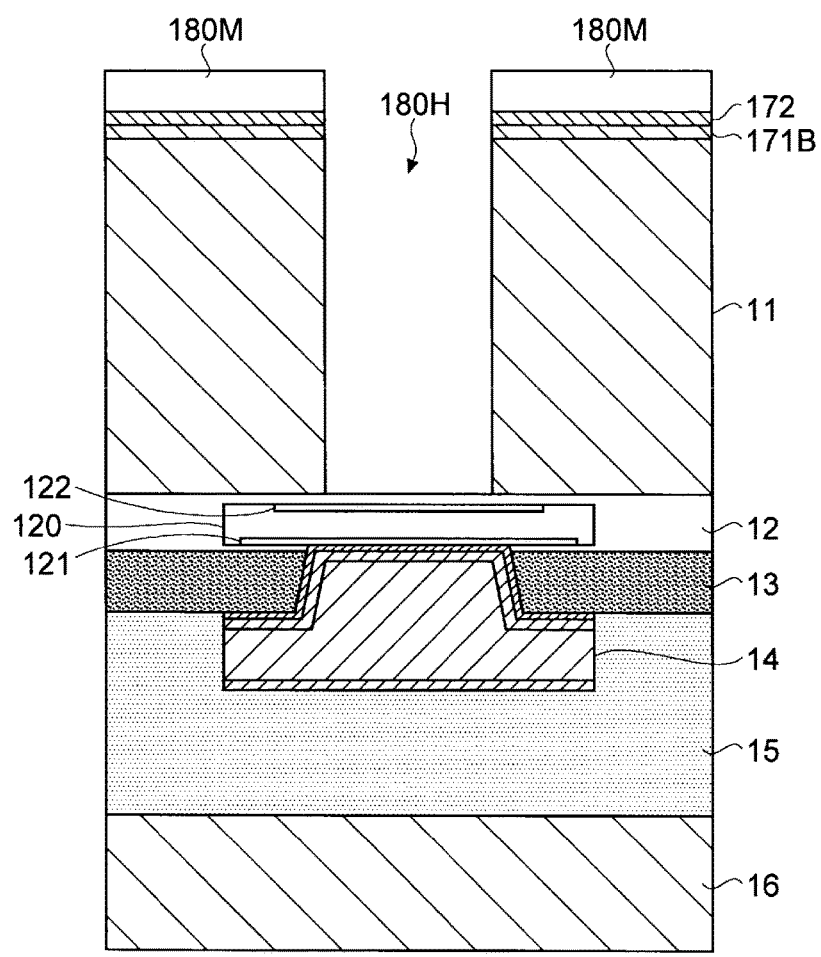

Then, a photosensitive photo resist 180M is applied on the silicon nitride film 172A, and an opening pattern for forming a second through electrode 18 is transferred to the photo resist 180M. In addition, the opening diameter of the opening pattern may be, for example, about 10 μm. Subsequently, as illustrated in FIG. 7, a through hole (TSV) 180H reaching a device layer 12 is formed by etching through the semiconductor substrate 11 from the second side thereof, with the photo resist 180M to which the opening pattern is transferred used as a mask. An anisotropic dry etching such as RIE by which high aspect ratio may be obtained and the like may be used for etching of the semiconductor substrate 11.

Figure 8:
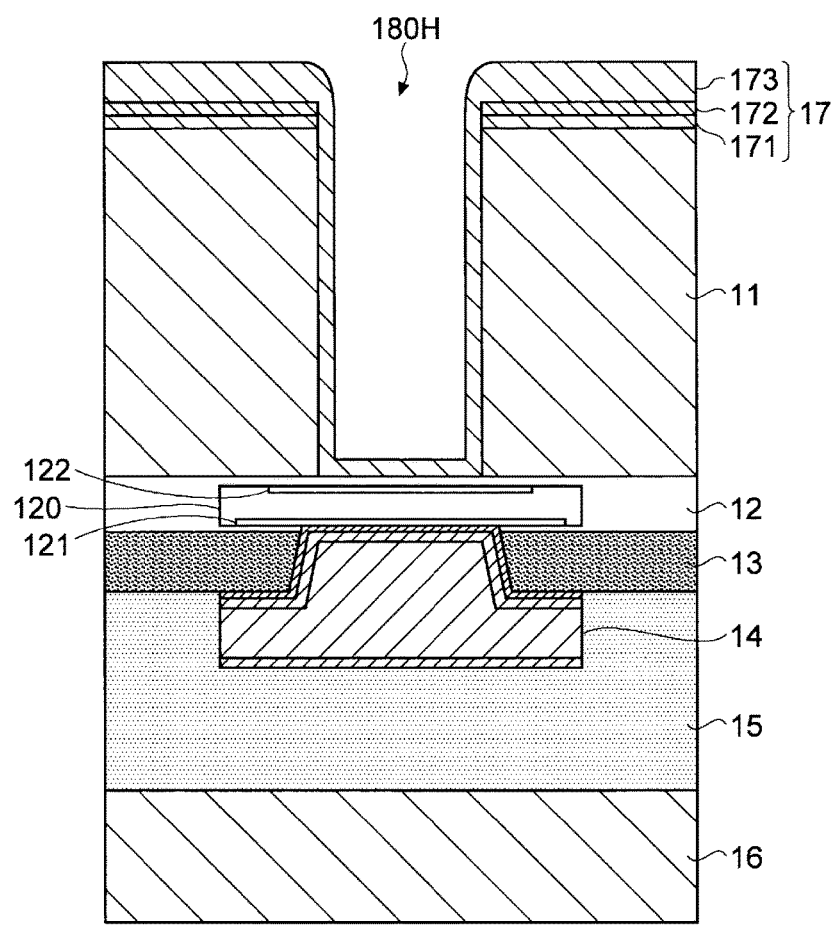

Then, as illustrated in FIG. 8, a silicon oxide film 173B is formed on the entire of the second surface of the semiconductor substrate 11 including the inside wall of the through hole (TSV) 180H. A CVD method and the like may be used for forming the silicon oxide film 173B.

Then, the silicon oxide film 173B which is formed on the bottom of the through hole (TSV) 180H is removed, by etching back the silicon oxide film 173B. The etching-back is performed until the insulating film (an interlayer insulating film may be included. This is sometimes referred to as a third insulating film) of the device layer 12 is removed and the lower layer wiring 122 is exposed. As a result, as illustrated in FIG. 9, the insulating layer 17 of three layers having the silicon oxide film 171, the silicon nitride film 172, and silicon oxide film 173 is formed on the second surface of the semiconductor substrate 11, and the inner wall surface of the through hole (TSV) 180H is covered with the silicon oxide film 173, and the lower layer wiring 122 of the device layer 12 is exposed at the bottom of the through hole (TSV) 180H.

Figure 9:
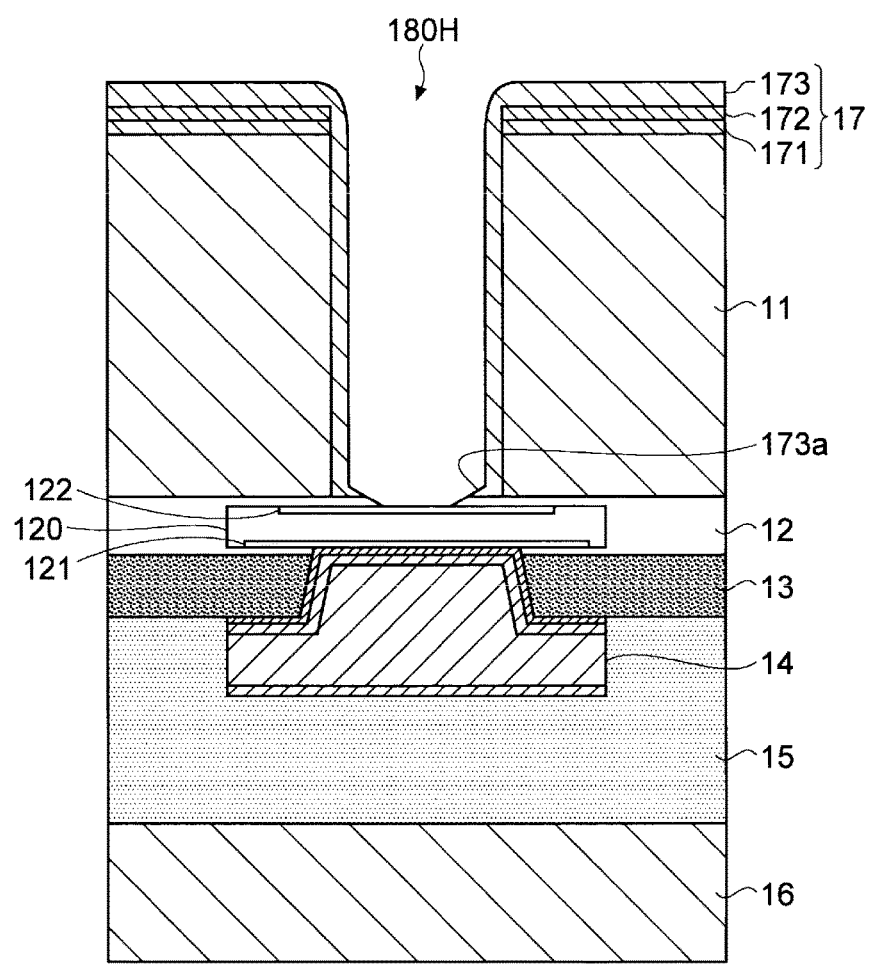

In addition, for example, anisotropic dry etching may be used for the etching-back in the process illustrated in FIG. 9. When performing etch back of the silicon oxide film 173, the bottom of the silicon oxide film 173 is formed into the tapered shape 173a by adjusting the etching conditions to provide somewhat isotropic (non-directional) etching. In addition, the elevation angle of the slope in the tapered shape 173a may be adjusted by adjusting the degree of isotropic etching by adjusting the etching conditions (e.g., typically, higher amount of isotropic etching can be achieved using one or more of reduced wafer bias, increased etch gas flow rates, and higher chamber pressure).

Figure 10:
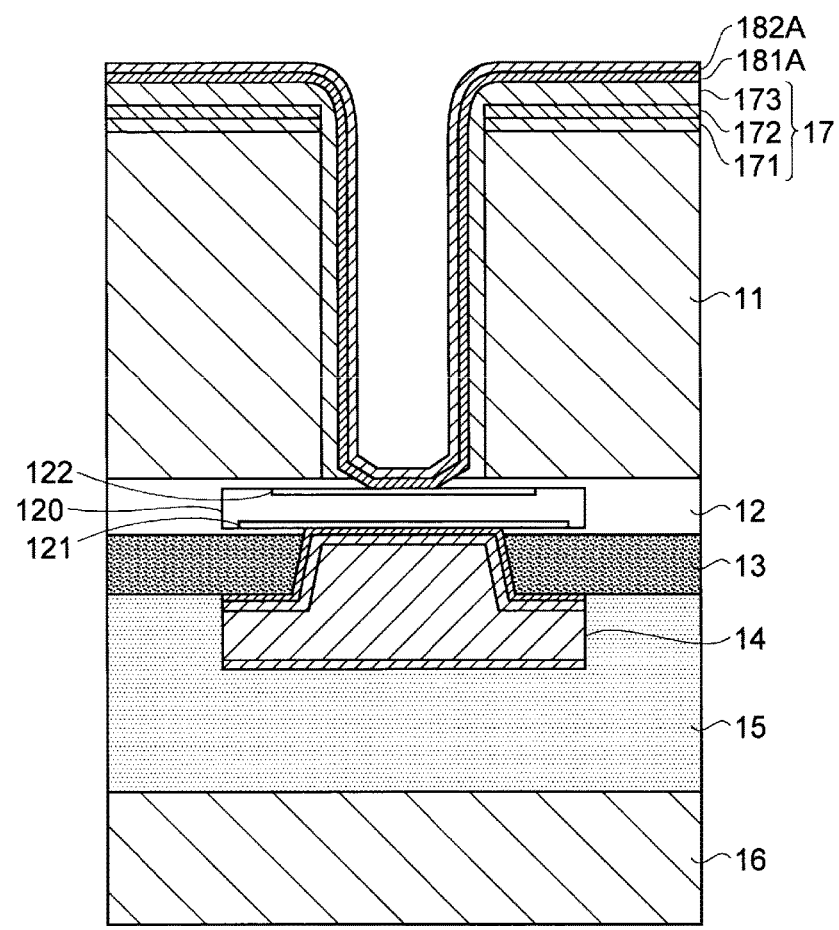

Then, the structure illustrated in FIG. 10 is obtained by sequentially forming a barrier metal layer 181A using titanium (Ti) and a seed metal layer 182A using copper (Cu) on the entire of the insulating layer 17 including the inside wall and base of the through hole in the same manner as the barrier metal layer 141A and the seed metal layer 142A. The barrier metal layer 181A and the seed metal layer 182A may be simply referred to as a metal layer in some cases. The film thickness of the seed metal layer 182A may be thicker than the seed metal layer 142A. In this process, since the bottom portion of the silicon oxide film 173 has a tapered shape 173a, as described further below, the efficiency of the reverse sputtering of the metal layer resulting at the time of forming the barrier metal layer 181A and the seed metal layer 182A is enhanced. Thus, since the amount of metal atoms scattered to the corners of the bottom of the silicon oxide film 173 by reverse sputtering is increased, it is possible to form the barrier metal layer 181A and the seed metal layer 182A more stably—that is, with improved (more complete/uniform) coverage of the underlying layers.

Figure 11:
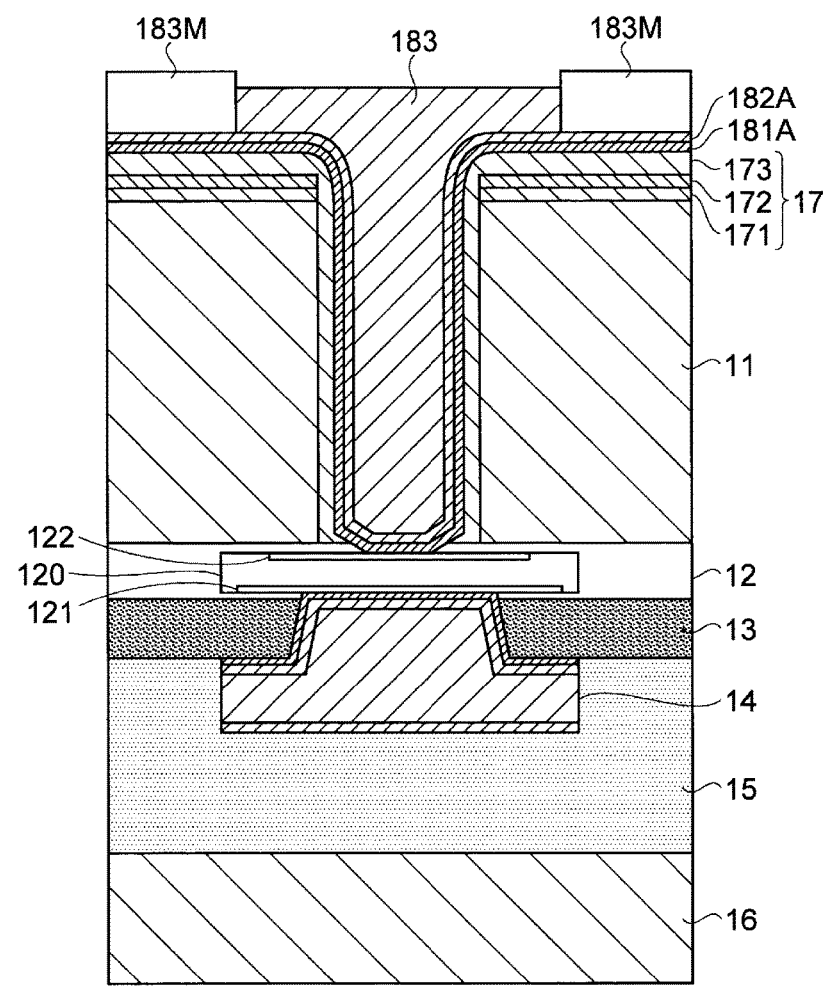

Then, a patterned mask 183M for forming a through electrode 183 on the seed metal layer 182A is formed, for example, by using a photolithography technology. An opening is formed through the mask 183M at a position corresponding to the through hole (TSV) 180H formed on the semiconductor substrate 11. Subsequently, as illustrated in FIG. 11, the through electrode 183 of nickel (Ni) is formed on the seed metal layer 182A exposed by the opening of the mask 183M. Conformal plating and the like may be used for the formation of the through electrode 183.

Then, after removing the mask 183M, the exposed portions of the seed metal layer 182A and the barrier metal layer 181A are removed. Wet etching may be used for the removal of the seed metal layer 182A and the barrier metal layer 181A. At that time, the etching condition may be used such that at least one of the seed metal layer 182 and the barrier metal layer 181 that remain without being etched overlap at least one of the silicon oxide film 171 and the silicon nitride film 172 in the insulating layer 17.

Then, A bonding material 19 is adhered on the upper surface of the through electrode 183 that protrudes from the insulating layer 17. An electrolytic plating method, a non-electrolytic plating method, or the like may be used for the formation of the bonding material 19. A second through electrode 18 which contacts the lower layer wiring 122 of the device layer 12 is formed by the above processes, and a semiconductor device 1 with a sectional structure as illustrated in FIG. 1 is manufactured.

As described above, according to the embodiment, since the bottom portion of the silicon oxide film 173 which is formed inside the through hole (TSV) 180H of the semiconductor substrate 11 has a tapered shape 173a, the corners of the bottom of the silicon oxide film 173 have an obtuse angle. Thus, it becomes possible to form the barrier metal layer 181 and the seed metal layer 182 in a stable manner—that is, with more complete coverage (avoidance of pin holes/bare spots in the layers) and better uniformity in layer thickness (at least with respect to avoidance of very thin spots in the layers). Further, since the slope of tapered shape 173*a* is inclined such that the incident angle θ of ion during the formation of the barrier metal layer 181 and the seed metal layer 182 is between 0° and 75°, preferably between 30° and 60°, and the efficiency of the reverse sputtering of the metal layer that is generated during the formation of the barrier metal layer 181 and the seed metal layer 182 is enhanced. Thus, since the amount of metal atoms scattered to the corners of the bottom of the silicon oxide film 173 by reverse sputtering is increased, it is possible to form the barrier metal layer 181 and the seed metal layer 182 more complete/uniform manner.

In addition, in the above description, the stacked film of the silicon oxide film 171, the silicon nitride film 172, and silicon oxide film 173 have been exemplified as the insulating layer 17, but the insulating layer 17 is not intended to be limited to these materials and layer structure. For example, instead of the insulating layer 17 using three layers of the silicon oxide film 171, the silicon nitride film 172, and silicon oxide film 173, it is also possible to use a single-layer film of a silicon oxide film, a silicon nitride film, or a nitride silicon oxide (SiON) film, or a stacked film of two or more of those films, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate having a first surface and a second surface opposite the first surface;
   a device layer on the first surface of the semiconductor substrate;
   a wiring in the device layer between a first side surface of the device layer and a second side surface of the device layer, the first side surface of the device layer contacting the first surface of the semiconductor substrate, the second side surface of the device layer being opposite the first side surface;
   a first insulating layer on the second side surface of the device layer;
   a first through electrode extending through the first insulating layer and contacting the device layer on the second side surface;
   a second through electrode extending through a hole in the semiconductor substrate from the first surface to the second surface, the second through electrode contacting the wiring in the device layer at the bottom of the hole; and
   a second insulating layer extending from the second surface of the semiconductor substrate to the bottom of the hole along an inner wall of the hole, the second insulating layer being between the semiconductor substrate and the second through electrode, wherein a portion of the second insulating layer at the bottom of the hole and contacting the first side surface of the device layer has a tapered surface with an inclination angle with respect to the first side surface of the device layer that is greater than 0°.

2. The semiconductor device according to claim 1, wherein the inclination angle is less than 75°.

3. The semiconductor device according to claim 1, wherein the inclination angle is between 30° and 60°.

4. The semiconductor device according to claim 1, wherein the second through electrode comprises:
   a first metal layer extending into contact with the wiring in the device layer through an opening in the second insulating layer at the bottom of the hole;
   a second metal layer formed on the first metal layer; and
   a third metal layer formed on the second metal layer.

5. The semiconductor device according to claim 1, wherein the second insulating layer includes:
   a first silicon nitride film formed on the second surface of the semiconductor substrate; and
   a second silicon nitride film extending from the first silicon nitride film to the bottom of the hole through the interior of the hole, wherein the portion of the second silicon nitride film at the bottom of the hole is tapered.

6. The semiconductor device according to claim 1, further comprising a bonding material on an end of the second through electrode opposite the bottom of the hole.

7. The semiconductor device according to claim 1, wherein the semiconductor substrate has a thickness of 50 micrometers or less.

* * * * *